(12) United States Patent
Suzuki et al.

(10) Patent No.: US 8,796,543 B2
(45) Date of Patent: Aug. 5, 2014

(54) ORGANIC THIN-FILM SOLAR CELL ELEMENT

(75) Inventors: Hiroyuki Suzuki, Tokyo (JP); Koujiro Ohkawa, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 912 days.

(21) Appl. No.: 11/390,228

(22) Filed: Mar. 27, 2006

(65) Prior Publication Data

US 2006/0261733 A1 Nov. 23, 2006

(30) Foreign Application Priority Data

Mar. 28, 2005 (JP) ................................. 2005-093301
Sep. 6, 2005 (JP) ................................. 2005-258579

(51) Int. Cl.
*H01L 51/46* (2006.01)
*H01L 51/00* (2006.01)

(52) U.S. Cl.
CPC ......... *H01L 51/0035* (2013.01); *H01L 51/0036* (2013.01); *H01L 51/0037* (2013.01); *H01L 51/0038* (2013.01); *H01L 51/0047* (2013.01)
USPC .......................................... 136/263; 438/82

(58) Field of Classification Search
USPC .................................. 136/263; 313/498–512
See application file for complete search history.

(56) References Cited

U.S. PATENT DOCUMENTS

| | | | |
|---|---|---|---|
| 5,986,206 A | 11/1999 | Kambe et al. | |
| 6,946,597 B2 * | 9/2005 | Sager et al. | 136/263 |
| 7,375,370 B2 * | 5/2008 | Forrest et al. | 257/40 |
| 7,772,487 B1 * | 8/2010 | Robinson | 136/263 |
| 2003/0127967 A1 * | 7/2003 | Tsutsui et al. | 313/498 |
| 2005/0014026 A1 * | 1/2005 | Park | 428/690 |
| 2005/0022856 A1 * | 2/2005 | Komatsu et al. | 136/243 |
| 2005/0224113 A1 * | 10/2005 | Xue et al. | 136/263 |

FOREIGN PATENT DOCUMENTS

| | | |
|---|---|---|
| JP | 06-318725 A | 11/1994 |
| JP | 2001-526466 A | 12/2001 |
| JP | 2003-264085 | 9/2003 |
| JP | 2005-032793 A | 2/2005 |

OTHER PUBLICATIONS

Mulfort et al., Preparation of Surface Initiated Polystyrenesulfonate Films and PEDOT doped by the Films, Polmer, vol. 44, pp. 3185-3192, 2003.*
Kang et al., Comparison of Photovoltaic Devices Based on MEH-PPV with Various Molecular Weights, Chinese Science Bulletin, vol. 49, No. 21, pp. 2259-2261, 2004.*
Zhang et al., Eletron and Hole Transport in Poly(Fluorene-Benzothiadole), Applied Physics Letters vol. 98, 143504, pp. 1-3, 2011.*
Two Layer organic photovoltaic cell, Applied Physics Letters, vol. 48, No. 2, p. 183-185.

* cited by examiner

*Primary Examiner* — Jayne Mershon
(74) *Attorney, Agent, or Firm* — Ladas & Parry LLP (57) ABSTRACT

An organic thin-film solar cell element is provided including either of the following embodiments: an electron hole transporting layer including an electron-donating electroconductive polymer material and an electron-accepting electroconductive polymer material, and a layer selected from the group consisting of the electron hole transporting layer, a hole transporting layer comprising an electron-donating electroconductive polymer material, and an electron transporting layer comprising an electron-accepting electroconductive polymer material directly laminated onto each other; or three or more layers selected from the group consisting of the electron hole transporting layer, the hole transporting layer, and the electron transporting layer directly laminated onto each other.

7 Claims, 4 Drawing Sheets

ORGANIC THIN-FILM SOLAR CELL ELEMENT

BACKGROUND OF THE INVENTION

1. Field of the Invention

The present invention relates to an organic thin-film solar cell element wherein plural layers each comprising an electroconductive polymer material are laminated.

2. Description of the Related Art

In order for organic thin-film solar cells to exhibit high photoelectric conversion performance, it has been desired to develop a photoelectric conversion layer capable of sufficiently absorbing solar light energy and efficiently converting the absorbed solar energy into electric energy.

Many organic semiconductor materials used in photoelectric conversion layers are insufficient in optical properties essential for the photoelectric conversion layers, for example, as follows: the absorption wavelength range thereof is narrow; and the extinction coefficient is small. For this reason, only rays having a specific wavelength range of solar rays (white rays) can be used for power generation. This is one of the reasons why the photoelectric conversion efficiency is low. Thus, according to a photoelectric conversion layer wherein plural layers are laminated, organic semiconductor materials having different absorption wavelength ranges are used in the respective layers, whereby light can be absorbed within a broad wavelength range. Additionally, the lamination of the plural layers makes the thickness of the photoelectric conversion layer large. Thus, it is expected that the absorbance can be made large.

The photoelectric conversion performance of organic thin-film cellar cells is lower than that of crystalline solar cells. One of the causes therefor is that the resistance barrier in the interface between their photoelectric conversion layer, which has a function of converting light energy into electric energy, and their electrode layer is large. If the resistance barrier in this interface is large, electric charges generated inside the photoelectric conversion layer cannot be taken out into an external circuit with a high efficiency.

In order to solve this problem, it is effective to form a charge taking-out layer between the photoelectric conversion layer and the electrode layer. This causes the resistance barrier between the photoelectric conversion layer and the electrode layer to be reduced, so that the transfer of electric charges is promoted.

In general, an organic semiconductor material is used in a photoelectric conversion layer and a charge taking-out layer. Organic semiconductor materials can be roughly classified into high-molecular materials and low molecular materials. The high molecular organic semiconductor materials have advantages that they can each be formed into a film by the coating thereof and further the formation of the thin film is easy. In particular, electroconductive polymer materials are excellent in film-formability.

However, when plural layers are formed into a lamination form by the coating, there is caused a problem that constituents of a lower layer out of the layers elute into a solvent in the coating solution for forming an upper layer, out of the layers, which is to be arranged on the lower layer. In general, therefore, as the solvent for the upper layer forming coating solution, there is used a solvent wherein the constituents of the lower layer are not dissolved at all (see, for example, C. W. Tang, "Two-layer organic photovoltaic cell", Applied Physics Letters, vol. 48, No. 2, pp. 183-185 (1986)). However, many of the polymeric organic semiconductor materials, in particular, almost all of electroconductive polymeric materials are dissolved in organic solvents having similar natures. It is therefore difficult to use difference in solubility in a solvent to laminate plural layers.

Conventionally, there has been known a method of using the above-mentioned method, wherein difference in solubility in a solvent is used, to laminate a hole transporting layer comprising a high molecular p type organic semiconductor material and an electron transporting layer comprising a high molecular n type organic semiconductor material by coating, so as to form a photoelectric conversion layer. In this process, difference between dielectric constants of solvents is chiefly used. However, according to this process, the high molecular organic semiconductor materials and solvents, which can be used, are restricted. Even if two layers can be made by laminating onto another layer by coating, it is very difficult to dissolve a high molecular organic semiconductor material into a solvent having a low dielectric constant suitable for a third layer since the solvent used to form the third layer is required to have a lower electric constant than the solvent used to form the second layer. For this reason, the upper limit according to this process is that two layers of a hole transporting layer and an electron transporting layer are laminated onto each other. Thus, in reality, three or more layers cannot be laminated onto each other.

In the case of forming an electron hole transporting layer comprising both of a high molecular p type organic semiconductor material and a high molecular n type organic semiconductor material, high molecular organic semiconductor materials and solvents which can be used are further limited. Thus, even if difference between dielectric constants of solvents is used, it is difficult to laminate plural electron hole transporting layers onto each other by coating.

Accordingly, there has not been any report about an organic thin-film solar cell element wherein plural photoelectric conversion layers are directly laminated onto each other.

Conventionally, the following process has been known; a process of using an aqueous mixture dispersion of polyethylenedioxythiophene/polystyrenesulfonic acid (PEDOT/PSS) to laminate plural layers. This is also the above-mentioned process, wherein difference in solubility into a solvent is used, and is a process of coating an aqueous mixture dispersion of PEDOT/PSS to form a first layer, and next coating, thereon, a solution wherein a high molecular organic semiconductor material is dispersed into an organic solvent to form a second layer. This PEDOT/PSS does not have a photoelectric conversion function, but has a function of stabilizing the taking-out of holes. Thus, the formation of the layer made of PEDOT/PSS makes it possible to improve the hole taking-out efficiency.

However, PEDOT/PSS is a special material out of high molecular organic semiconductor materials, and can be dispersed in water. On the other hand, among high molecular organic semiconductor materials other than PEDOT/PSS, materials, which can be dispersed in water, are almost unknown. For this reason, there is not any report about an organic thin-film solar cell element wherein a photoelectric conversion layer and a charge taking-out layer wherein a high molecular organic semiconductor material other than PEDOT/PSS is used are directly laminated onto each other.

For example, Japanese Patent Application Laid-Open (JP-A) No. 2003-264085 discloses an organic film solar cell and an organic electroluminescent element wherein plural functional organic thin-film layers are laminated onto each other through an electroconductive thin-film layer. According to the JP-A No. 2003-264085, it is disclosed that a high molecular organic semiconductor material can be used in this functional organic thin-film layer or electro conductive thin-film layer. However, about the lamination of plural layer by use of a high molecular organic semiconductor material, only an example wherein the aqueous dispersion of PEDOT/PSS is used is given in working examples therein.

SUMMARY OF THE INVENTION

The present invention has been made in light of the above-mentioned problems, and a main object thereof is to provide an organic thin-film solar cell element wherein an electroconductive polymer material is used to laminate plural layers onto each other in order to attain, for example, effective use of light or an improvement in the taking-out efficiency of electric charges.

To achieve the above-mentioned object, the present invention provides an organic thin-film solar cell element, comprising either of the following embodiments: wherein an electron hole transporting layer comprising an electron-donating electroconductive polymer material and an electron-accepting electroconductive polymer material, and a layer selected from the group consisting of the same electron hole transporting layer, a hole transporting layer comprising an electron-donating electroconductive polymer material, and an electron transporting layer comprising an electron-accepting electroconductive polymer material are directly laminated onto each other; or wherein three or more layers selected from the group consisting of the electron hole transporting layer, the hole transporting layer, and the electron transporting layer as described above are directly laminated onto each other.

According to the invention, a structure is formed wherein plural ones among the electron hole transporting layer(s), the hole transporting layer(s) and the electron transporting layer(s) are combined with each other and laminated onto each other, thereby making it possible to realize, for example, effective use of light or an improvement in the taking-out efficiency of electric charges. The plural ones among the electron hole transporting layer(s), the hole transporting layer(s) and the electron transporting layer(s) are directly laminated onto each other. It is therefore unnecessary to form any interposing layer between the respective layers. Thus, the invention has an advantage that the production process can be made simple.

In the present invention, the above-mentioned electron hole transporting layer(s), hole transporting layer, and electron transporting layer are preferably coated layers. In other words, the electron hole transporting layer(s), the hole transporting layer(s) and the electron transporting layer(s) are preferably those formed by coating. According to the coating, the layers can be formed by a simple method, and a vacuum equipment is unnecessary unlike a vapor depositing method or the like. Thus, costs for the production can be reduced.

Further, in the present invention, the electron hole transporting layer and the hole transporting layer may be directly laminated onto each other. Alternatively, the electron hole transporting layer and the electron transporting layer may be directly laminated onto each other. In the case of making such structure of the invention into an organic thin-film solar cell, this structure makes it possible to transfer holes or electrons effectively from the electron hole transporting layer to its electrode layer.

Furthermore, in the present invention, two or more of the electron hole transporting layers may be directly laminated onto each other. This structure makes it possible to use light effectively.

Still furthermore, in the present invention, the electron hole transporting layer, at least one of the hole transporting Layer and the electron transporting layer, and the electron hole transporting layer may be directly laminated in this order onto each other. This structure makes it possible to promote the taking-out of electric charges and further realize effective use of light.

The present invention provides an organic thin-film solar cell, comprising the above-mentioned organic thin-film solar cell element. The organic thin-film solar cell of the invention makes it possible to attain high efficiency since the organic thin-film solar cell element having the above-mentioned advantages is used.

In the invention, a structure is formed wherein plural ones among the electron hole transporting layer(s), the hole transporting layer(s) and the electron transporting layer(s) are combined with each other and laminated onto each other, thereby producing the following advantageous effects: a photoelectric conversion function, a charge taking-out promoting function, an interface reforming function, and other functions can be improved, so that performances of the element can be improved.

DESCRIPTION OF THE PREFERRED EMBODIMENTS

The organic thin-film solar cell element of the invention and the organic thin-film solar cell thereof will be described in detail below. In the present specification, the organic thin-film solar cell element means organic layers sandwiched between electrodes, that is, only organic layers which are obtained by laminating plural ones out of one or more electron hole transporting layers, one or more hole transporting layers, and one or more electron transporting layers and which are sandwiched therebetween.

A. Organic Thin-Film Solar Cell Element

An organic thin-film solar cell element of the present invention comprises either of the following embodiments: wherein an electron hole transporting layer comprising an electron-donating electroconductive polymer material and an electron-accepting electroconductive polymer material, and a layer selected from the group consisting of the same electron hole transporting layer, a hole transporting layer comprising an electron-donating electroconductive polymer material, and an electron transporting layer comprising an electron-accepting electroconductive polymer material are directly laminated onto each other; or wherein three or more layers selected from the group consisting of the electron hole transporting layer, the hole transporting layer, and the electron transporting layer are directly laminated onto each other.

With reference to the drawings, the organic thin-film solar cell element of the invention will be described below.

Figure 1:
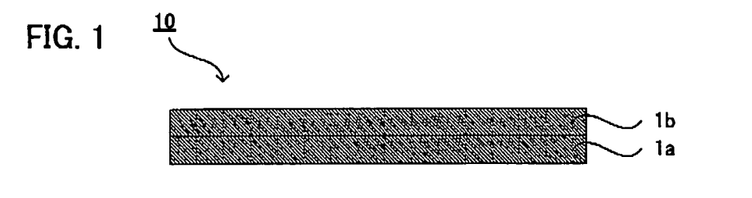
FIG. 1 is a schematic sectional view illustrating an example of the organic thin-film solar cell element of the invention.
Figure 2:
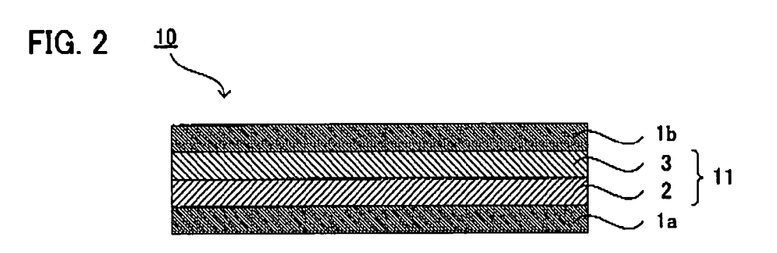
FIG. 2 is a schematic sectional view illustrating another example of the organic thin-film solar cell element of the invention.

FIGS. 1 and 2 are each a schematic sectional view illustrating an example of the organic thin-film solar cell element of the invention. In the example illustrated in FIG. 1, an organic thin-film solar cell element 10 according to the invention has electron hole transporting layers 1a and 1b comprising an electron-donating electroconductive polymer material and an electron-accepting electroconductive polymer material, and the two electron hole transporting layers 1a and 1b are directly laminated onto each other. In the example illustrated in FIG. 2, an organic thin-film solar cell element 10 according to the invention has an electron hole transporting layer 1a, a hole transporting layer 2 comprising an electron-donating electroconductive polymer material, an electron transporting layer 3 comprising an electron-accepting electroconductive polymer material and an electron hole transporting layer 1b, and the electron hole transporting layer 1a, the hole transporting layer 2, the electron transporting layer 3 and the electron hole transporting layer 1b are directly laminated in this order onto each other.

In FIG. 2, pn junction is formed in the interface between the hole transporting layer 2 and the electron transporting layer 3 so that electric charges are separated. Thus, the hole transporting layer 2 and the electron transporting layer 3 act in the form of a pair of the two layers so as to function as a photoelectric conversion layer 11. The electron hole transporting layer functions as a photoelectric conversion layer by itself since this layer comprises both of the electron-donating electroconductive polymer material and the electron-accepting electroconductive polymer material. The "photoelectric conversion layer" referred to herein means a member contributing to charge separation of the organic thin-film solar cell element and having a function of transporting generated electrons and holes toward opposite electrode layers, respectively.

Accordingly, it can be stated that FIG. 1 illustrates a structure wherein two photoelectric conversion layers are directly laminated onto each other, and FIG. 2 illustrates a structure wherein three photoelectric conversion layers are directly laminated on to each other. In such an organic thin-film solar cell element, wherein plural photoelectric conversion layers are directly laminated onto each other, electroconductive polymer materials having absorption wavelength ranges different from each other can be used in the respective photoelectric conversion layers. Therefore, the absorption wavelength range, which the whole of the organic thin-film solar cell element has, can be made broad. In the case of using electro conductive polymer materials having the same absorption wavelength range in the respective photoelectric conversion layers, the organic thin-film solar cell element having the plural photoelectric conversion layers is thicker than an organic thin-film solar cell element having only one photoelectric conversion layer; therefore, it appears that the absorbency can also be made larger with the increase in the thickness. Accordingly, the direct lamination of the plural photoelectric conversion layers makes it possible to manufacture an organic thin-film solar cell element capable of generating electric power over a broad wavelength range and realizing a high photoelectric conversion efficiency.

Figure 3A:
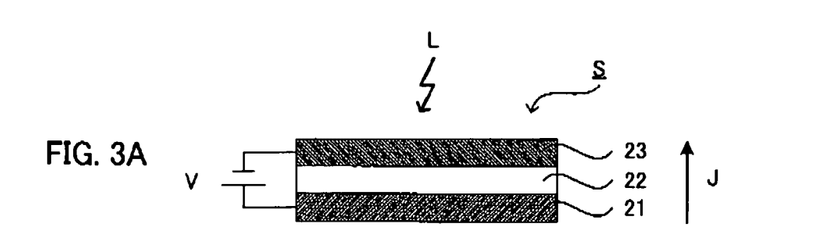
FIGS. 3A to 3C are each an explanatory view for explaining an organic thin-film solar cell.
Figure 3B:
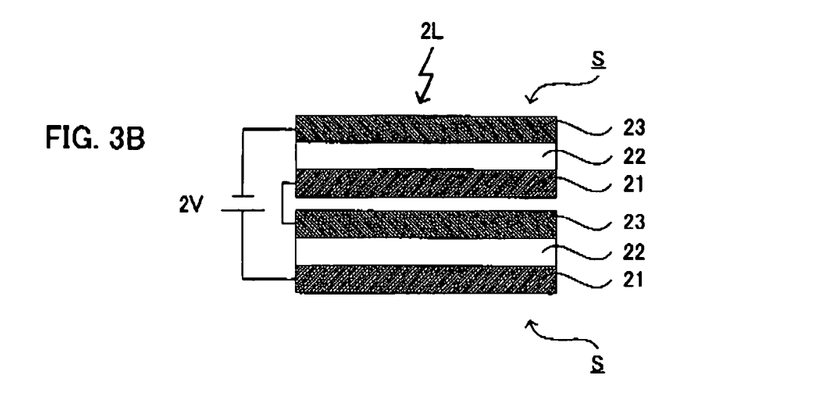
Figure 3C:
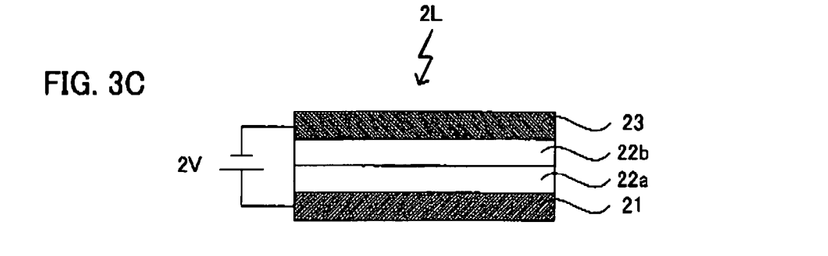

FIGS. 3A to 3C each illustrate an example of an organic thin-film solar cell comprising an organic thin-film solar cell element. FIG. 3C illustrates an organic thin-film solar cell comprising the organic thin-film solar cell element illustrated in FIG. 1.

In an organic thin-film solar cell S having a structure wherein a photoelectric conversion layer 22 is sandwiched between two electrode layers 21 and 23, the following is supposed: a light energy L is radiated into the photoelectric conversion layer 22, thereby generating an electric current J and giving an electromotive force V (FIG. 3A). When two of the organic thin-film solar cells S are connected to each other in series and a light energy 2L is radiated thereto, an electromotive force (=2V) which is two times as large as V can be obtained if equal light energy components (=2L/2=L) can be supplied into each of the two organic thin-film solar cells S (FIG. 3B). In short, when plural organic thin-film solar cells connected to each other in series can each absorb light, the electromotive force increases accordingly.

In the invention, for example, photoelectric conversion layers 22a and 22b are directly laminated onto each other, whereby it is expected that the same level electromotive force 2V as generated when two organic thin-film solar cells are connected in series can be mimetically obtained (FIG. 3C). Accordingly, the photoelectric conversion efficiency can be made higher, and ideally, the photoelectric conversion layers can be used not as plural organic thin-film solar cells connected in series but as one organic thin-film solar cell.

Figure 4:
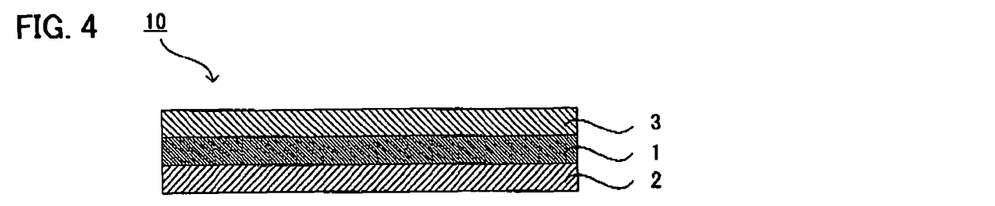
FIG. 4 is a schematic sectional view illustrating another example of the organic thin-film solar cell element of the invention.
Figure 5:
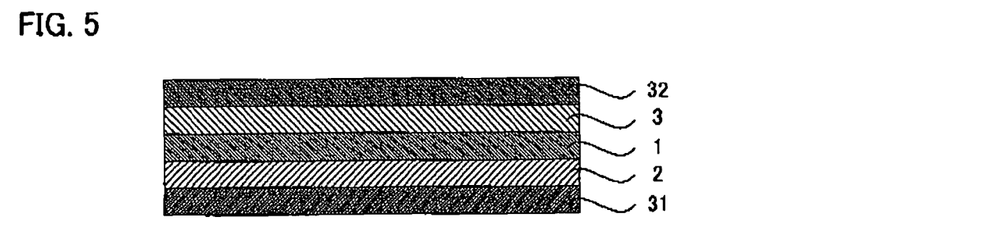
FIG. 5 is a schematic sectional view illustrating an example of an organic thin-film solar cell using the organic thin-film solar cell element of the invention.

Another example of the organic thin-film solar cell element of the invention is illustrated in FIG. 4. In the example illustrated in FIG. 4, an organic thin-film solar cell element 10 according to the invention is an element wherein a hole transporting layer 2, an electron hole transporting layer 1 and an electron transporting layer 3 are directly laminated in this order onto each other. In this organic thin-film solar cell element 10, the electron hole transporting layer 1 functions as a photoelectric conversion layer so that charges are generated inside the electron hole transporting layer 1. FIG. 5 illustrates an example of an organic thin-film solar cell having a structure wherein the organic thin-film solar cell element 10 illustrated in FIG. 4 is sandwiched between two electrode layers 31 and 32. In FIG. 5, electrons and holes generated inside the electron hole transporting layer 1 transfer toward respective electrode layers 31 and 32 in opposite directions. At this time, the hole transporting layer 2 and the electron transporting layer 3 are formed between the electron hole transporting layer 1 and the electrode layer 31 and between the layer 1 and the electrode layer 32, respectively; consequently, resistance barriers in the interfaces between the electron hole transporting layer 1 and the electrode layers 31 and 32 can be decreased respectively so that the holes and the electrons can be effectively taken out.

Figure 6:
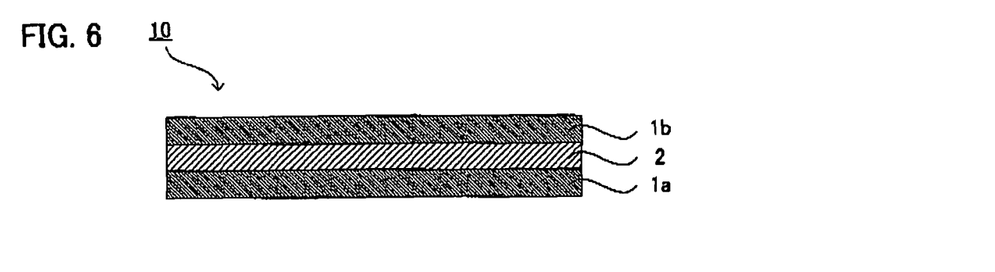
FIG. 6 is a schematic sectional view illustrating another example of the organic thin-film solar cell element of the invention.
Figure 7:
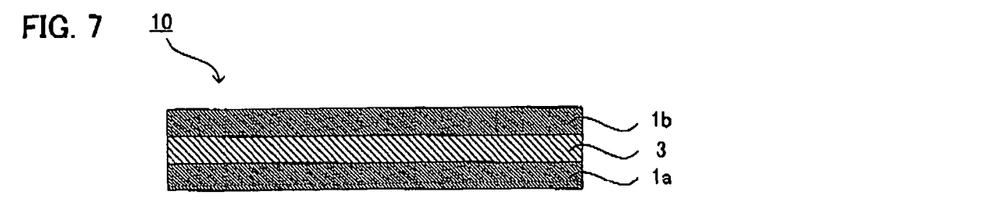
FIG. 7 is a schematic sectional view illustrating another example of the organic thin-film solar cell element of the invention.

Other examples of the organic thin-film solar cell element of the invention are illustrated in FIGS. 6 and 7.

In an organic thin-film solar cell element 10 illustrated in FIG. 6, an electron hole transporting layer 1a, a hole transporting layer 2, and an electron hole transporting layer 1b are directly laminated in this order onto each other. In this organic thin-film solar cell element 10, the electron hole transporting layers 1a and 1b function as photoelectric conversion layers so that charges are generated inside the electron hole transporting layers 1a and 1b. In the case of using the organic thin-film solar cell element 10 illustrated in FIG. 6 to manufacture an organic thin-film solar cell, electrons and holes generated inside the electron hole transporting layers 1a and 1b transfer toward respective electrode layers in opposite directions. At this time, the hole transporting layer 2 is formed between the electron hole transporting layers 1a and 1b; consequently, a resistance barrier in the interface between the electron hole transporting layers 1a and 1b can be decreased. When the electron hole transporting layer 1a is, for example, at the side of an anode, holes transfer easily from the electron hole transporting layer 1b to the electron hole transporting layer 1a. Thus, the taking-out efficiency of holes can be improved.

In the organic thin-film solar cell element 10 illustrated in FIG. 7, an electron hole transporting layer 1a, an electron transporting layer 3 and an electron hole transporting layer 1b are directly laminated in this order onto each other. In the case of using this organic thin-film solar cell element 10 to manufacture an organic thin-film solar cell, electrons and holes generated inside the electron hole transporting layers 1a and 1b transfer toward respective electrode layers in opposite directions. At this time, the electron transporting layer 3 is formed between the electron hole transporting layers 1a and 1b; consequently, a resistance barrier in the interface between the electron hole transporting layers 1a and 1b can be decreased. When the electron hole transporting layer 1b is, for example, at the side of a cathode, electrons transfer easily from the electron hole transporting layer 1a to the electron hole transporting layer 1b. Thus, the taking-out efficiency of electrons can be improved.

Figure 8:
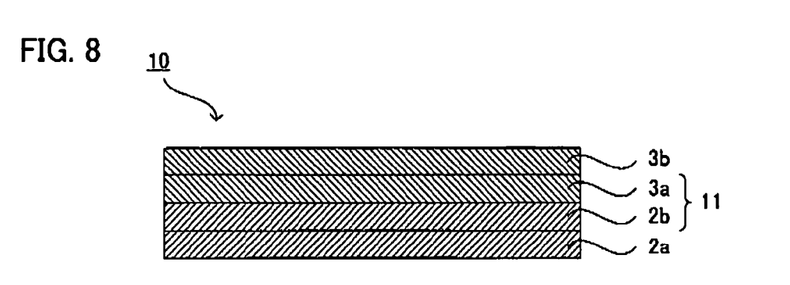
FIG. 8 is a schematic sectional view illustrating another example of the organic thin-film solar cell element of the invention.

FIG. 8 illustrates a still another example of the organic thin-film solar cell element of the invention. In an organic thin-film solar cell element 10 illustrated in FIG. 8, a hole transporting layer 2a, a hole transporting layer 2b, an electron transporting layer 3a and an electron transporting layer 3b are directly laminated in this order onto each other. In this organic thin-film solar cell element 10, the hole transporting layer 2b and the electron transporting layer 3a function as a photoelectric conversion layer 11 in the form of a pair of the two layers. In the interface between the hole transporting layer 2b and the electron transporting layer 3a, pn junction is formed to generate charges. In the case of using this organic thin-film solar cell element 10 to manufacture an organic thin-film solar cell, electrons and holes generated in the interface between the hole transporting layer 2b and the electron transporting layer 3a transfer toward respective electrode layers in opposite directions. At this time, the hole transporting layer 2a and the electron transporting layer 3b are respectively formed between the hole transporting layer 2b and one of the electrode layers and between the electron transporting layer 3a and the other electrode layer; consequently, resistance barriers in the interfaces between the hole transporting layer 2b and electron transporting layer 3a and the respective electrode layers can be decreased. Thus, the taking-out efficiency of holes and electrons can be improved.

When a hole transporting layer or an electron transporting layer which does not function as a photoelectric conversion layer is formed adjacent to an electron hole transporting layer, or a hole transporting layer and an electron transporting layer, which function as a photoelectric conversion layer as described above, the resistance barrier(s) in the interfacets) between the layers is/are relieved so that the taking-out of charges can be promoted. Since the taking-out of charges can be promoted, there is an advantage that it is unnecessary to form a charge taking-out layer separately, as formed in the prior art.

The case that "a hole transporting layer or an electron transporting layer which does not function as a photoelectric conversion layer" is the case that the hole transporting layer and the electron transporting layer are not formed adjacent to each other. On the other hand, when a hole transporting layer and an electron transporting layer are formed adjacent to each other, in the interface between the hole transporting layer and the electron transporting layer pn junction is formed so that charges are separated. Accordingly, the hole transporting layer and the electron transporting layer come to function as photoelectric conversion layers.

Accordingly, the invention has a structure wherein plural ones from among electron hole transporting layers, hole transporting layers and electron transporting layers are combined with each other and laminated, and the structure makes it possible to realize effective use of light, an improvement in the taking-out efficiency of charges, and soon. Additionally, the combined electron hole transporting layer(s), hole transporting layer(s) and electron transporting layer(s) are directly laminated onto each other; therefore, the invention has an advantage that no interposing layer is formed between any two out of the layers and thus the production process can be made simple.

The combined electron hole transporting layer(s), hole transporting layer(s) and electron transporting layer(s) may be: a combination of an electron hole transporting layer and one layer selected from the group consisting of an electron hole transporting layer, a hole transporting layer and an electron transporting layer; or a combination of three or more layers selected from the group consisting of electron hole transporting layers, hole transporting layers and electron transporting layers. Advantageous effects obtained by these layer-combinations appear to be different. Examples of the combinations include a combination (1) wherein an electron hole transporting layer, or a hole transporting layer and an electron transporting layer, which functions) as a photoelectric conversion layer, are repeatedly formed; and a combination (2) wherein "an electron hole transporting layer, or a hole transporting layer and an electron transporting layer, which function as a photoelectric conversion layer", and "a hole transporting layer or an electron transporting layer which does not function as a photoelectric conversion layer" are repeatedly formed.

Figure 9:
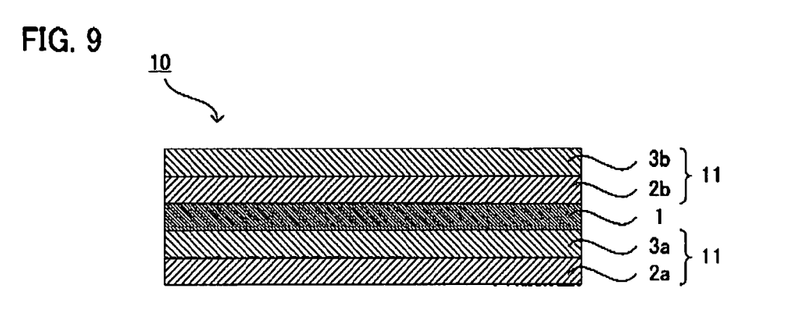
FIG. 9 is a schematic sectional view illustrating another example of the organic thin-film solar cell element of the invention.

Specific examples of the combination (1) include the following combinations: (i) electron hole transporting layer/electron hole transporting layer (see FIG. 1); (ii) hole transporting layer/electron transporting layer/hole transporting layer/electron transporting layer; (iii) electron hole transporting layer/hole transporting layer/electron transporting layer; (iv) hole transporting layer/electron transporting layer/electron hole transporting layer; (v) electron hole transporting layer/electron hole transporting layer/electron hole transporting layer; (vi) hole transporting layer/electron transporting layer/hole transporting layer/electron transporting layer/hole transporting layer/electron transporting layer; (vii) hole transporting layer/electron transporting layer/electron hole transporting layer/electron hole transporting layer; (viii) electron hole transporting layer/hole transporting layer/electron transporting layer/electron hole transporting layer (see FIG. 2); (ix) electron hole transporting layer/electron hole transporting layer/hole transporting layer/electron transporting layer; (x) hole transporting layer/electron transporting layer/hole transporting layer/electron transporting layer/electron hole transporting layer; (xi) hole transporting layer/electron transporting layer/electron hole transporting layer/hole transporting layer/electron transporting layer (see FIG. 9); and (xii) electron hole transporting layer/hole transporting layer/electron transporting layer/hole transporting layer/electron transporting layer.

Specific examples of the combination (2) include the following combinations: (xiii) hole transporting layer/electron hole transporting layer; (xiv) electron hole transporting layer/ electron transporting layer; (xv) hole transporting layer/electron hole transporting layer/electron transporting layer (see FIG. 4); (xvi) hole transporting layer/hole transporting layer/ electron transporting layer/electron transporting layer (see FIG. 8); (xvii) electron hole transporting layer/hole transporting layer/electron hole transporting layer (see FIG. 6); (xviii) electron hole transporting layer/electron transporting layer/ electron hole transporting layer (see FIG. 7); (xix) hole transporting layer/electron hole transporting layer/electron hole transporting layer: (xx) electron hole transporting layer/electron hole transporting layer/electron transporting layer; (xxi) hole transporting layer/electron hole transporting layer/electron hole transporting layer/electron transporting layer; (xxii) hole transporting layer/hole transporting layer/electron transporting layer; (xxiii) hole transporting layer/electron transporting layer/electron transporting layer; (xxiv) hole transporting layer/electron hole transporting layer/electron hole transporting layer/electron hole transporting layer; (xxv) electron hole transporting layer/electron hole transporting layer/electron hole transporting layer/electron transporting layer; and (xxvi) hole transporting layer/electron hole transporting layer/electron hole transporting layer/electron hole transporting layer/electron transporting layer.

For example, "A/B/C" herein indicates that A, B and C are laminated in this order to each other.

In the figures, reference numbers 1, 1*a* and 1*b* each represent an electron hole transporting layer; 2,2*a* and 2*b*, a hole transporting layer; 3, 3*a* and 3*b*, an electron transporting layer; 10, an organic thin-film solar cell element; and 11, a photoelectric conversion layer.

Of the above-mentioned combinations, the combination "electron hole transporting layer/electron hole transporting layer/electron hole transporting layer" is preferred in the invention. This is because a high photoelectric conversion efficiency can be expected by effective use of light on the basis of the lamination of the electron hole transporting layers. The combination "hole transporting layer/electron hole transporting layer/electron transporting layer" or "hole transporting layer/electron hole transporting layer/electron hole transporting layer/electron transporting layer" is also preferred. This is because a high photoelectric conversion efficiency can be expected by the promotion of the taking-out of charges on the basis of the hole transporting layer and the electron transporting layer.

When plural photoelectric conversion layers (electron hole transporting layers, or one or more hole transporting layers and one or more electron transporting layers) are laminated as in the combination (1), effective use of light can be attained as described above. In this case, electroconductive polymer materials used in the plural photoelectric conversion layers may have absorption wavelength ranges different from each other. In this case, the absorption wavelength range can be extended. When electroconductive polymer materials used in the plural photoelectric conversion layers have the same absorption wavelength range, the absorbance can be increased.

In order to realize effective use of light, it is advisable to select appropriately the absorption wavelength of the electron-donating electroconductive polymer material or the electron-accepting electroconductive polymer material in the photoelectric conversion layer. Since the electron hole transporting layer contains the electron-donating electroconductive polymer material and the electron-accepting electroconductive polymer material, it is sufficient that any one of the electron-donating electroconductive polymer material and the electron-accepting electroconductive polymer material has a given absorption maximum wavelength. About the hole transporting layer and the electron transporting layer, the hole transporting layer contains the electron-donating electroconductive polymer material and the electron transporting layer contains the electron-accepting electroconductive polymer material; therefore, it is sufficient that any one of the electron-donating electroconductive polymer material used in the hole transporting layer and the electron-accepting electroconductive polymer material used in the electron transporting layer has a given absorption maximum wavelength.

When the electron-donating electroconductive polymer material has the given absorption maximum wavelength at this time, the electron-accepting electroconductive polymer material is not particularly limited as long as the material is a material capable of combining the above-mentioned electron-donating electroconductive polymer material to form pn junction, thereby separating charges. Similarly, when the electron-accepting electroconductive polymer material has the given absorption maximum wavelength, the electron-donating electroconductive polymer material is not particularly limited as long as the material is a material capable of combining the above-mentioned electron-accepting electroconductive polymer material to form pn junction, thereby separating charges.

In the case of using electron-donating electroconductive polymer materials having absorption wavelength ranges different from each other in the electron hole transporting layer or the hole transporting layer, it is preferred that the difference between the absorption maximum wave lengths which the respective electron-donating electroconductive polymer materials has is about 50 nm or more in order for the layer to absorb sunlight (white light) in a wide range.

In this case, it is particularly preferred to laminate three layers of the photoelectric conversion layers (the electron hole transporting layers, or the combinations of the hole transporting layer and the electron transporting layer). In the case of using, for example, an electron-donating electroconductive polymer material having an absorption maximum wavelength in a red wavelength range as the first layer, an electron-donating electroconductive polymer material having an absorption maximum wavelength in a green wavelength range as the second layer and an electron-donating electroconductive polymer material having an absorption maximum wavelength in a blue wavelength range as the third layer, sunlight (white light) can be absorbed in a broader range.

Specific examples of the structure thereof include (a) electron hole transporting layer/electron hole transporting layer/ electron hole transporting layer; (b) hole transporting layer/ electron transporting layer/hole transporting layer/electron transporting layer/hole transporting layer/electron transporting layer; (c) hole transporting layer/electron transporting layer/electron hole transporting layer/electron hole transporting layer; (d) electron hole transporting layer/hole transporting layer/electron transporting layer/electron hole transporting layer; (e) electron hole transporting layer/electron hole transporting layer/hole transporting layer/electron transporting layer; (f) hole transporting layer/electron transporting layer/hole transporting layer/electron transporting layer/electron hole transporting layer; (g) hole transporting layer/electron transporting layer/electron hole transporting layer/hole transporting layer/electron transporting layer; and (h) electron hole transporting layer/hole transporting layer/electron transporting layer/hole transporting layer/electron transporting layer.

The following will describe each of the constituents of the organic thin-film solar cell of the invention.

1. Electron Hole Transporting Layer

Any electron hole transporting layer used in the invention is a layer comprising an electron-donating electroconductive polymer material and an electron-accepting electroconductive polymer material. The electron hole transporting layer is a layer having both of electron-accepting and electron-donating functions. Since charge separation is caused by use of pn junction formed in the electron hole transporting layer, the layer functions as a photoelectric conversion layer by itself.

In order to generate charges effectively, it is preferred to disperse the electron-donating electroconductive polymer material and the electron-accepting electroconductive polymer material homogeneously in the electron hole transporting layer. At this time, the blend ratio between the electron-donating electroconductive polymer material and the electron-accepting electroconductive polymer material is appropriately adjusted into an optimal blend ratio in accordance with the kind of the used electroconductive polymer materials.

The electron-donating electroconductive polymer material is not particularly limited as long as the material is a material having a function as an electron donor. Examples thereof include a polyphenylene, a polyphenylenevinylene, a polysilane, a polythiophene, a polycarbazole, a polyvinylcarbazole, a porphyrin, a polyacetylene, a polypyrrole, a polyaniline, a polyfluorene, a polyvinylpyrene, a polyvinylanthracene, and derivatives thereof and copolymers thereof; and phthalocyanine-containing polymers, carbazole-containing polymers, and organic metal polymers.

Of the above, the following are preferably used: thiophene-fluorene copolymers, polyalkylthiophene, phenyleneethynylene-phenylenevinylene copolymers, phenyleneethynylene-thiophene copolymers, phenyleneethynylene-fluorene copolymers, fluorene-phenylenevinylene copolymers, thiophene-phenylenevinylene copolymers, and so on. These give an appropriate energy level difference with respect to many electron-accepting electroconductive polymer materials.

For example, a process for synthesizing a phenyleneethynylene-phenylenevinylene copolymer (poly[1,4-phenylene-ethynylene-1,4-(2,5-dioctadodecyloxyphen ylene)-1,4-phenyleneethene-1,2-diyl-1,4-(2,5-dioctadodecylo xyphenylene)ethene-1,2-diyl]) is described in detail in Macromolecules, 35, 3825 (2002) or Mcromol. Chem. Phys., 202, 2712 (2001).

On the other hand, the electron-accepting electroconductive polymer material is not particularly limited as long as the material is a material having a function as an electron acceptor. Examples thereof include a polyphenylenevinylene, a polyfluorene and derivatives thereof and copolymers thereof; or carbon nanotubes, fullerene derivatives, a CN- or $CF_3$-containing polymer, and $CF_3$-substituted polymers thereof. Specific examples of the polyphenylenevinylene derivatives include a CN-PPV (poly[2-methoxy-5-(2'-ethylhexyloxy)-1,4-(1-cyanovinylene)phenylene]), and a MEH-CN-PPV (poly[2-methoxy-5-(2'-ethylhexyloxy)-1,4-(1-cyanovinylene)phenylene]).

As the electron-donating electroconductive polymer material and the electron-accepting electroconductive polymer material, for example, an electron-accepting electroconductive polymer material doped with an electron-donating compound and an electron-donating electroconductive polymer material doped with an electron-accepting compound can be used.

The electron-accepting electroconductive polymer material to be doped with the electron-donating compound may be the above-mentioned electron-accepting electroconductive polymer material. The electron-donating compound for the doping may be a Lewis base, such as an alkali metal or an alkaline earth metal, for example, Li, K, Ca or Cs. The Lewis base acts as an electron donor.

The electron-donating electroconductive polymer material to be doped with the electron-accepting compound may be the above-mentioned electron-donating electroconductive polymer material. The electron-accepting compound for the doping may be, for example, a Lewis acid such as $FeCl_3$ (III), $AlCl_3$, $AlBr_3$, $AsF_6$ or a halogen compound. The Lewis acid acts as an electron acceptor.

In general, the film thickness of the electron hole transporting layer is not particularly limited as long as the thickness is a thickness adopted in bulk hetero-junction type organic thin-film solar cells. Specifically, the thickness can be set into the range of 0.2 to 3000 nm, preferably 1 to 600 nm. If the film thickness of the electron hole transporting layer is larger than the range, the volume resistance of the electron hole transporting layer may be increased. If the film thickness of the electron hole transporting layer is smaller than the range, a short circuit may be caused between the electrode layers.

2. Hole Transporting Layer

Any hole transporting layer used in the invention is a layer comprising an electron-donating electroconductive polymer material.

The electron-donating electroconductive polymer material is not particularly limited as long as the material is a material having a function as an electron donor. Specific examples thereof include the same as described as the examples of the electron-donating electroconductive polymer material used in the electron hole transporting layer.

The film thickness of the hole transporting layer is not particularly limited. Specifically, the film thickness can be set into the range of 0.1 to 1500 nm, preferably in a range of 1 to 300 nm. If the film thickness of the hole transporting layer is larger than the range, the volume resistance of the hole transporting layer may be increased. If the film thickness of the hole transporting layer is smaller than the range, a short circuit may be caused between the electrode layers.

3. Electron Transporting Layer

Any electron transporting Layer used in the invention is a layer comprising an electron-accepting electroconductive polymer material.

The electron-accepting electroconductive polymer material is not particularly limited as long as the material is a material having a function as an electron acceptor. Specific examples thereof include the same as described as the examples of the electron-accepting electroconductive polymer material used in the electron hole transporting layer.

The film thickness of the electron transporting layer is not particularly limited. Specifically, the film thickness can be set into the range of 0.1 to 1500 nm, preferably in a range of 1 to 300 nm. If the film thickness of the electron transporting layer is larger than the range, the volume resistance of the electron transporting layer may be increased. If the film thickness of the electron transporting layer is smaller than the range, a short circuit may be caused between the electrode layers.

4. Process for Manufacturing the Organic Thin-Film Solar Cell Element

The method for forming the electron hole transporting layer(s), the hole transporting layer(s) and the electron transporting layer(s) used in the invention is not particularly limited as long as the method is a method capable of laminating the respective layers stably to form the layers which respectively have a given thickness homogeneously. Coating is preferably used. In other words, it is preferred that the electron hole transporting layer(s), the hole transporting layer(s) and the electron transporting layer(s) are each a coated film.

In the invention, the "coated film" is a film formed by coating, and is, for example, a film formed by coating a coating solution.

In this case, it is preferred that a layer, which is to underlie the coated film, comprises a polymer material having a relatively high weight-average molecular weight. For example, in the case of forming, on one of the electron hole transporting layers, different one thereof, it is preferred that the first layer-electron hole transporting layer (underlying layer) comprises an electroconductive polymer material having a relatively high weight-average molecular weight. This makes it possible to restrain constituents of the first layer-electron hole transporting layer (underlying layer) from eluting out into a solvent in a coating solution for forming the second layer-electron hole transporting layer (upper layer forming coating solution), so as to produce an advantage that the kind of a solvent used in a coating solution for forming the second layer-electron hole transporting layer (upper layer forming coating solution) is not limited. Accordingly, many of the layers can be laminated by use of such a method.

The weight-average molecular weight of the polymer material is preferably 100,000 or more, more preferably 300,000 or more, and most preferably 500,000 or more. Furthermore, the weight-average molecular weight is preferably 5,000,000 or less, and more preferably 3,000,000 or less. If the weight-average molecular weight of the polymer material is too small, the polymer material may be dissolved in the solvent in the upper layer forming coating solution. Conversely, if the weight-average molecular weight of the polymer material is too large, the viscosity of the underlying layer forming coating solution is increased so that a homogeneous coated film may not be formed at ease.

The weight-average molecular weight is a value measured by gel permeation chromatography (GPC) Conditions for the measurement are as follows:
Measuring column: HF-2002 manufactured by SHOWA DENKO K.K., styrene-divinylbenzene copolymer
Detector:
 Differential refractive index detector (RI), RID-6A, manufactured by Shimadzu Corporation, and
 Ultraviolet ray absorbing detector, SPD-10A manufactured by Shimadzu Corporation, measuring wavelength=254 nm
Measuring conditions:
 Mobile phase=chloroform,
 Flow rate=3 ml/min., and
 Injecting method=injection of 2 ml with a syringe The polymer material the weight-average molecular weight of which is within the above-mentioned given range may be one used as the above-mentioned electron-donating electroconductive polymer material or electron-accepting electroconductive polymer material used in the electron hole transporting layer(s), hole transporting layer(s) and electron transporting layer(s); or may be a polymer material used in addition to the above-mentioned electron-donating electroconductive polymer material or electron-accepting electroconductive polymer material.

The above-mentioned polymer material is not particularly limited as long as the material is a polymer material which is not dissolved in the solvent in the upper layer forming coating solution, and is appropriately selected in accordance with the kind of the solvent used in the upper layer forming coating solution. Specific examples thereof include the same as described as the examples of the above-mentioned electron-donating electroconductive polymer material or electron-accepting electroconductive polymer material.

As the method for making the above-mentioned polymer material into a higher molecular weight to have the given weight-average molecular weight, an ordinarily used method can be adopted. Examples thereof include an oxidation polymerization, an electrolytic polymerization, a vapor deposition polymerization, a chemical polymerization, and an energy radiating polymerization. The higher-degree polymerizing method is appropriately selected in accordance with the kind of the polymer material. For example, about the method for making a polyphenylene vinylene (MDMO-PPV, poly(2-methoxy-5-(3',7'-dimethyloctyloxy)-1-4-phenylenevinylene)) into a higher molecular weight, a method described in Thin Solid Films, 363, 98-101 (2002) can be referred to.

When the electron hole transporting layer(s), the hole transporting layer(s) and the electron transporting layer(s) are each formed by coating, the formation can be attained by dispersing an electron-donating or electron-accepting electroconductive polymer material into a solvent to prepare a coating solution and then coating this coating solution.

The solvent used in the coating solution is not particularly limited as long as the solvent is a solvent wherein an electron-donating electroconductive polymer material or electron-accepting electroconductive polymer material can be dispersed.

Examples of the method for coating the coating solution include a die coating, a spin coating, a dip coating, a roll coating, a bead coating, a spray coating, a bar coating, a gravure coating, an inkjet printing, a screen printing, and an offset printing. Of these, the spin coating or the die coating is preferably used. These methods make it possible to form each of the electron hole transporting layer(s), the hole transporting layer(s) and the electron transporting layer(s) precisely to have the given film thickness.

When the electron hole transporting layer(s), the hole transporting layer(s) and the electron transporting layer(s) are laminated, it is allowable to partially use the method described in the item "Description of the Related Art", wherein difference in solubility to a solvent is used, together with the above-mentioned method. In the case of forming, for example, the following: hole transporting layer (a first layer)/electron hole transporting layer (a second layer)/electron transporting layer (a third layer), it is possible to use the solubility-difference-using method when the electron hole transporting layer (the second layer) is formed on the hole transporting layer (the first layer) and use the method of incorporating a polymer material having a relatively large weight-average molecular weight into the electron hole transporting layer (the second layer) when the electron transporting layer (the third layer) is formed on the electron hole transporting layer (the second layer).

B. Organic Thin-Film Solar Cell

The following will describe the organic thin-film solar cell of the invention.

The organic thin-film solar cell of the invention is characterized in that the above-mentioned organic thin-film solar cell element is used therein; and is a cell having a substrate, a first electrode layer formed over the substrate, the organic thin-film solar cell element formed over the first electrode layer, and a second electrode layer formed over the organic thin-film solar cell element.

Each of the constituents of the organic thin-film solar cell will be described below, 1. First and Second Electrode Layers The material used in the first electrode layer and the second electrode layer is not particularly limited as long as the material has electroconductivity, and is appropriately selected under consideration of, for example, the radiating direction of light or the taking-out direction thereof, the work function which the material should have, and others. For example, in the case of radiating light onto the side of the substrate or taking out light therefrom, the first electrode layer is preferably rendered a transparent electrode. The transparent electrode may be an ordinarily used transparent electrode. Specific examples thereof include In—Zn—O (IZO), In—Sn—O (ITO), ZnO—Al, and Zn—Sn—O. For example, in the case of using a material having a low work function for the second electrode layer, it is preferred to use a material having a high work function for the first electrode layer. Examples of the high work function material include Au, Ag, Co, Ni, Pt, C, ZTO, $SnO_2$, $SnO_2$ doped with fluorine, and ZnO. Examples of the low work function material include Li, In, Al, Ca, Mg, Sm, Tb, Yb, Zr, and LiF.

The method for forming the first electrode layer and the second electrode layer may be an ordinary electrode-forming method. Examples thereof include PVD methods such as a vacuum vapor deposition, a sputtering and an ion plating; and CVD methods.

The first electrode layer and the second electrode layer may each be formed onto the whole of the underlying surface, or formed into a pattern form. The method for the patterning is not particularly limited as long as the method is a method capable of forming a desired pattern with a high precision. The method is, for example, a photolithography.

The first electrode layer and the second electrode layer may each be a single layer or a multi-layer wherein materials having different work functions are used.

2. Substrate

The substrate may be transparent or opaque. For example, in the case of radiating or taking light from the side of the substrate, it is preferred to use a transparent substrate. This transparent substrate is not particularly limited, and may be a plate made of a transparent rigid material, which is nonflexible, such as quartz glass, Pyrex (registered trademark) glass or synthetic quartz, or a film or plate made of a transparent flexible material, such as transparent resin or resin for optics.

Of the above, the transparent flexible film made of resin or the like is preferred as the substrate. This is because the transparent film made of resin is so excellent in workability that the film is useful for decreasing the production costs, making the substrate light, and realizing an organic thin-film solar cell which is not easily cracked and further the applicability of the film to various articles, such as the application thereof to an article having a curved surface, becomes higher.

3. Charge Taking-Out Layer

In the invention, a charge taking-out layer may be formed between the organic thin-film solar cell element and the first or second electrode layer.

For example, a hole taking-out layer may be formed between the organic thin-film solar cell element and an anode. The hole taking-out layer is a layer formed to take out holes easily from the organic thin-film solar cell element to the anode. This makes it possible to make the taking-out efficiency of holes from the organic thin-film solar cell element to the anode high so as to improve the photoelectric conversion efficiency.

The material used in the hole taking-out layer is not particularly limited as long as the material is a material which stabilizes the taking-out of holes from the organic thin-film solar cell element to the anode. Specific examples thereof include electroconductive organic compounds such as a polyaniline, a polyphenylenevinylene, a polythiophene, a polypyrrole, a polyparaphenylene, a polyacetylene, and a triphenyldiamine (TPD) which are each doped; and organic materials which are each capable of forming a charge transfer complex made of an electron-donating compound such as a tetrathiofluvalene or a tetramethylphenylenediamine and an electron-accepting compound such as a tetracyanoquinodimethane or a tetracyanoethylene. A metal such as Au, In, Ag or Pd, which will be formed into a thin film, can also be used. The metal thin film may be used alone or in combination with one or more of the above-mentioned organic materials.

Of these materials, a polyethylenedioxythiophene (PEDOT) or a triphenyldiamine (TPD) is particularly preferred.

The film thickness of the hole taking-out layer is preferably in a range of 10 to 200 nm when one or more of the above organic materials are used. The film thickness is preferably in a range of 0.1 to 5 nm when the metal thin film is used.

For example, an electron taking-out layer may be formed between the organic thin-film solar cell element and a cathode. The electron taking-out layer is a layer formed to take out electrons easily from the organic thin-film solar cell element to the cathode. This makes it possible to make the taking-out efficiency of electrons from the organic thin-film solar cell element to the cathode high so as to improve the photoelectric conversion efficiency.

The material used in the electron taking-out layer is not particularly limited as long as the material is a material which stabilizes the taking-out of electrons from the organic thin-film solar cell element to the cathode. Specific examples thereof include electroconductive organic compounds such as a polyaniline, a polyphenylenevinylene, a polythiophene, a polypyrrole, a polyparaphenylene, a polyacetylene, and a triphenyldiamine (TPD) which are each doped; or organic materials which are each capable of forming a charge transfer complex made of an electron-donating compound such as a tetrathiofluvalene or a tetramethylphenylenediamine and an electron-accepting compound such as a tetracyanoquinodimethane or a tetracyanoethylene. Other examples thereof include alkali metals or alkaline earth metals which are each doped to form a metal doped layer. Preferred examples thereof include metal doped layer of metals, such as a basocuproin (BCP) or a basophenanthroline (Bphen) and Li, Cs, Ba or Sr.

4. Other Constituents

If necessary, the organic thin-film solar cell of the invention has the following constituent(s) besides the above-mentioned constituents: for example, a protecting sheet, a filler layer, a barrier layer, a protecting hard coat layer, a strength supporting layer, a dirt-preventing layer, a highly light-reflecting layer, a light-confining layer, an ultraviolet ray/infrared ray blocking layer, a sealing material layer and other functional layers; and an adhesive layer, which is formed between the functional layers in accordance with the layer structure of the organic thin-film solar cell.

(Protecting Sheet)

The protecting layer may be formed on the second electrode layer in the invention. The protecting sheet is a layer formed to protect the organic thin-film solar cell from the outside.

The protecting sheet may be a metal plate or metal foil made of aluminum or the like, or a sheet made of fluorine-contained resin, cyclic polyolefin-contained resin, polycarbonate-contained resin, poly(meth)acrylic-contained resin, polyamide-contained resin, polyester-contained resin or the like, or a composite sheet wherein a weather resistant film and a barrier film are laminated on to each other. The protecting sheet may have barrier property. The protecting sheet may be subjected to coloration or the like so as to have design property. At this time, the protecting sheet may be colored by kneading a pigment into the sheet or by laminating a colored layer, such as a blue hard coat layer, onto the sheet.

The thickness of the protecting sheet is preferably in a range of 20 to 500 μm, more preferably 50 to 200 μm.

(Filler Layer)

The filler layer may be formed between the second electrode layer and the protecting sheet in the invention. The filler layer is a layer formed to cause the rear surface side of the organic thin-film solar cell, that is, the second electrode layer to adhere onto the protecting sheet so as to seal up the organic thin-film solar cell.

The filler layer may be any filler layer that is ordinarily used as the filler layer of solar cells, and may be made of, for example, ethylene-vinyl acetate copolymer resin.

The thickness of the filler layer is preferably in a range of 50 to 2000 μm, more preferably 200 to 800 μm. If the thickness is smaller than this range, the strength falls. Conversely, if the thickness is larger than the range, cracks or the like are easily generated.

(Barrier Layer)

The barrier layer may be formed on the surface of the substrate or the surface of the protecting sheet in the invention. When the substrate or the protecting sheet is made of plural layers, the barrier layer may be formed between any two of the layers. The barrier layer is a transparent layer formed to prevent oxygen or water vapor from the outside from entering the organic thin-film solar cell so as to protect the cell.

About the barrier layer, the oxygen transmittance thereof is preferably 5 cc/m$^2$/day or less, more preferably 0.1 cc/m$^2$/day or less. The lower limit of the oxygen transmittance is $5.0 \times 10^{-3}$ cc/m$^2$/day/atm from the viewpoint of the precision of the measuring device which is an oxygen gas transmittance measuring device (OX-TRAN 2/21, manufactured by MOCON Inc.). The oxygen transmittance is a value measured with this device at 23° C. and 90% RH.

The water vapor transmittance is preferably 5 g/m$^2$/day or less, more preferably 0.01 g/m$^2$/day or less at 37.8° C. and 100% RH, and is preferably 1 g/m$^2$/day or less at 40° C. and 90% RH. The lower limit of the water vapor transmittance is $5.0 \times 10^{-3}$ g/m$^2$/day from the viewpoint of the precision of the measuring device which is a water vapor transmittance measuring device (PERMATRAN-W3/33, manufactured by MOCON Inc.). The water vapor transmittance is a value measured with this device.

The material for forming the barrier layer is not particularly limited as long as the material is a material capable of gaining the above-mentioned barrier property, and may be, for example, an inorganic oxide, a metal, or a sol gel material. Specifically, examples of the inorganic oxide include a silicon oxide ($SiO_x$), an aluminum oxide ($Al_nO_m$), a titanium oxide ($TiO_2$), an yttrium oxide, a boron oxide ($B_2O_3$), a calcium oxide (CaO), and a silicon oxynitrocarbide ($SiO_xN_yC_z$). Examples of the metal include Ti, Al, Mg and Zr. Examples of the sol gel material include siloxane-based so gel materials. These materials may be used alone or in combination of two or more thereof.

The film thickness of the barrier layer is appropriately selected in accordance with the kind of the used material, and others. The film thickness is preferably in a range of 10 to 1000 nm. If the film thickness is smaller than this range, a sufficient barrier property may not be obtained. If the film thickness is larger than the range, a long time is required for the formation of the film.

The barrier layer may be mono-layered or multi-layered. In the case of the multi-layered barrier layer, layers may be directly laminated onto each other or may be stuck onto each other.

Examples of the method for forming the barrier layer include vapor deposition methods such as a sputtering, an ion plating and other PVD methods, and CVD methods; a roll coating; and a spin coating. These methods may be combined.

The barrier layer is not particularly limited as long as the layer is a layer having the above-mentioned barrier property. Preferably, the barrier layer has a vapor deposited layer formed by a vapor deposition method from the viewpoint of a high barrier property thereof, and so on.

The vapor deposited layer is not particularly limited about the kind of the vapor depositing method therefor, or the like as long as the layer is a layer formed by the vapor deposition. The vapor deposition method may be a CVD method or a PVD method. When the vapor deposited layer is formed by, for example, a CVD method such as a plasma CVD, the formed layer can become a dense layer having a high barrier property. However, it is preferred to use a PVD method from the viewpoint of production efficiency, costs and others. The PVD method may be, for example, a vacuum vapor deposition, a sputtering or ion plating method, and particularly the vacuum vapor deposition method is preferred from the viewpoint of the barrier property of the layer formed by the method, and others. Specific examples of the vacuum vapor deposition method include a vacuum vapor deposition method in an electron beam (EB) heating manner, and that in a high frequency induction heating manner.

The material for the vapor deposited layer is preferably a metal or an inorganic oxide. Examples thereof include Ti, Al, Mg, Zr, a silicon oxide, an aluminum oxide, a silicon oxynitride, an aluminum oxynitride, a magnesium oxide, a zinc oxide, an indium oxide, a tin oxide, an yttrium oxide, $B_2O_3$, and CaO. Of these, the silicon oxide is more preferred since the layer made of silicon oxide has a high barrier property and a high transparency.

The thickness of the vapor deposited layer is varied in accordance with the kind of the used material or the structure of the organic thin-film solar cell, and is preferably in a range of 5 to 1000 nm, more preferably 10 to 500 nm. If the thickness of the vapor deposited layer is smaller than this range, the layer may not easily be a uniform layer so that the above-mentioned barrier property may not be obtained. If the thickness of the vapor deposited layer is larger than the range, cracks or the like may be generated in the layer by an external factor, such as tension, after the layer is formed, so that the barrier property may be remarkably damaged. Additionally, a considerable time is required for the formation so that the productivity also falls.

As an underlying layer of the barrier layer, an anchor layer may be formed. This makes it possible to make the barrier property or the weather resistance high. Examples of the material for forming the anchor layer include adhesive resins, inorganic oxides, organic oxides, and metals.

Examples of the method for forming the anchor layer include a sputtering, an ion plating, and other PVD methods, CVD methods, a roll coating, a spin coating, and combinations thereof. Among these, an in-line coating at the time of forming the layer is particularly preferable. This is excellent in mass productivity and also makes it possible to make the adhesiveness of the anchor layer high.

(Protecting Hard Coat Layer)

The protecting hard coat layer may be formed on the outermost surface of the organic thin-film solar cell in the invention. The protecting hard coat layer is a layer having ultraviolet shielding property and weather resistance, and is a layer formed to protect the electron hole transporting layer(s), the hole transporting layer(s) and the electron transporting layer(s) in order to protect the organic thin-film solar cell from external environment, thereby preventing a deterioration in the electroconductive polymer materials contained in these layers.

The material for forming the protecting hard coat layer is not particularly limited as long as the material is a material having ultraviolet shielding property and weather resistance. Examples thereof include acrylic-contained resins, fluorine-contained resins, silicone-contained resins, melamine-contained resins, polyester-contained resins, and polycarbonate-contained resins. These resins may be used alone or in combination of two or more thereof.

A light resistant additive may be added to the resin(s). Examples of the light resistant additive include a light stabilizer (HALS) and an ultraviolet absorbent (UVA).

The film thickness of the protecting hard coat layer is preferably in a range of 0.5 to 20 μm. If the film thickness is smaller than this range, the ultraviolet shielding property and the weather resistance may become insufficient. If the film thickness is larger than the range, coating work of the film becomes difficult so that the mass productivity may be poor.

Examples of the method for forming the protecting hard coat layer include a sputtering, an ion plating, and other PVD methods, CVD methods, a roll coating, a spin coating, and combinations thereof. Among these, the roll coating is preferably used. The roll coating is excellent in mass productivity, and also makes it possible to form a protecting hard coat layer good in ultraviolet shielding property and weather resistance.

As an underlying layer of the protecting hard coat layer, an anchor layer may be formed. This makes it possible to make the weather resistance high.

Examples of the method for forming the anchor layer include a sputtering, anion plating, and other PVD methods, CVD methods, a roll coating, a spin coating, and combinations thereof. Among these, an in-line coating at the time of forming the layer is particularly preferable. This is excellent in mass productivity and also makes it possible to make the adhesiveness of the anchor layer high.

(Strength Supporting Layer)

The strength supporting layer may be formed at the inner side of the protecting hard coat layer. The position where the strength supporting layer is formed may be any position as long as the position is at the inner side of the protecting hard coat layer. The strength supporting layer is preferably formed between any two of the functional layers. Alternatively, the function of the strength supporting layer may be given to the substrate itself.

The strength supporting layer is excellent in heat resistance, wet heat resistance, hydrolysis resistance, and transparency.

About the heat resistance, it is preferred that when a heat resistance test is made wherein the layer is kept at a temperature of 100° C. for 72 hours, the decreasing ratio of the power generating efficiency after the test to that before the test is 10% or less. Furthermore, it is preferred that when a heat resistance test is made wherein the layer is kept at a temperature of 125° C. for 72 hours, the decreasing ratio of the power generating efficiency after the test to that before the test is 10% or less. The heat resistance test is made in accordance with JIS C60068-2-2.

About the wet heat resistance, it is preferred that when a wet heat test is made wherein the organic thin-film solar cell is held for 96 hours or longer in a thermo-hygrostat environment the inside temperature and humidity of which are beforehand adjusted to 40° C. or higher and 90% RH or more, respectively, the decreasing ratio of the power generating efficiency after the test to that before the test is 10% or less. Furthermore, it is preferred that when a wet heat test is made wherein the organic thin-film solar cell is held for 500 hours or longer in a thermo-hygrostat environment the inside temperature and humidity of which are beforehand adjusted to 80° C. or higher and 80% RH or more, respectively, the decreasing ratio of the power generating efficiency after the test to that before the test is 10% or less. The wet heat test is made in accordance with JIS C60068-2-3, using an environment test machine "HIFLEX α series FX424P", manufactured by Kusumoto Chemicals Ltd.

About the transparency, the transmittance to entire rays is preferably 70% or more, more preferably 85% or more. The transmittance to entire rays is a value measured in the range of visible rays by use of an SM Color Computer (model number; SM-C) manufactured by Suga Test Instruments Co., Ltd.

This is because the organic thin-film solar cell is required to have excellent heat resistance, wet heat resistance, and transparency.

Examples of the material for forming the strength supporting layer include a silicone-contained resin, an acrylic-contained resin, a cyclic polyolefin-contained resin, a syndiotactic polystyrene (SPS)-contained resin, a polyamide (PA)-contained resin, a polyacetal (POM)-contained resin, a modified polyphenylene ether (mPPE)-contained resin, a polyphenylene sulfide (PPS)-contained resin, a fluorine-contained resin (polytetrafluoroethylene (PTEE), an ethylene/tetrafluoroethylene copolymer (ETFE), a polychlorotrifluoroethylene (PCTFE), a fluorinated ethylene propylene (FEP)), a polyetheretherketone (PEEK)-contained resin, a liquid crystal polymer (LCP), a polyethernitrile (PEN)-contained resin, a polysulfone (PSF)-contained resin, a polyethersulfone (PES)-contained resin, a polyarylate (PAR)-contained resin, a polyamideimide (PAI)-contained resin, a polyimide (PI)-contained resin, a polyethylene terephthalate (PEN), a polypropylene (PP), an acrylonitrile/butadiene/styrene copolymer (ASS), a biaxially oriented polystyrene (OPS), a polyethylene terephthalate (PET), a polybutylene terephthalate (PBT), a polycarbonate (PC), a polyester (FE), and a polyacrylonitrile (PAN). These resins in a weather resistant grade can also be used. Furthermore, these resins may each be combined with glass fiber or the like to make the strength higher.

The film thickness of the strength supporting layer is preferably in a range of 10 to 800 μm, more preferably 100 to 400 μm. If the film thickness is smaller than this range, a sufficient strength may not be obtained. If the film thickness is larger than the range, the work in the production process may become difficult.

(Adhesive Layer)

The adhesive layer may be formed between any two of the layers in accordance with the layer structure.

The adhesive layer is a layer excellent in heat resistance and wet heat resistance.

About the heat resistance, it is preferred that when a heat resistance test is made wherein the layer is kept at a temperature of 100° C. for 72 hours, the decreasing ratio of the power generating efficiency after the test to that before the test is 10% or less. Furthermore, it is preferred that when a heat resistance test is made wherein the layer is kept at a temperature of 125° C. for 72 hours, the decreasing ratio of the power generating efficiency after the test to that before the test is 10% or less.

About the wet heat resistance, it is preferred that when a wet heat test is made wherein the organic thin-film solar cell is held for 96 hours or longer in a thermo-hygrostat environment the inside temperature and humidity of which are beforehand adjusted to 40° C. or higher and 90% RH or more, respectively, the decreasing ratio of the power generating efficiency after the test to that before the test is 10% or less. Furthermore, it is preferred that when a wet heat test is made wherein the organic thin-film solar cell is held for 500 hours or longer in a thermo-hygrostat environment the inside temperature and humidity of which are beforehand adjusted to 80° C. or higher and 80% RH or more, respectively, the decreasing ratio of the power generating efficiency after the test to that before the test is 10% or less.

This is because the organic thin-film solar cell is required to have excellent heat resistance and wet heat resistance. The heat resistance test and the wet heat test are made in accordance with those mentioned above.

Examples of the material for forming the adhesive layer include a silicone-contained resin, a rubber-contained resin, an acrylic-contained resin, a polyester urethane-contained resin, a vinyl acetate-contained resin, a polyvinyl alcohol-contained resin, a phenol-contained resin, a melamine-contained resin, a hot-melt based resin, a polyurethane-contained resin, a polyolefin-contained resin, an epoxy resin, and a styrene butadiene-contained resin. These resins of a weather resistant grade can also be used.

The film thickness of the adhesive layer is preferably in a range of 1 to 200 μm, more preferably 2 to 20 μm. If the film thickness is smaller than this range, the strength may be poor. If the film thickness is larger than the range, the work in the production process may become difficult.

Examples of the method for forming the adhesive layer include dry laminating and melting extrusion laminating methods. The adhesive layer may be laminated through an adhesive sheet. Preferably, the dry laminating method by roll coating is used. This method is excellent in mass productivity so as to give a good adhesiveness.

The invention is not limited to the above-mentioned embodiments. The embodiments are illustrative, and any embodiment which has a construction which is substantially equivalent to the technical conception recited in the claims of the invention and produces similar effects is included in the technical scope of the invention.

EXAMPLES

Hereinafter, the invention will be specifically described by way of working examples and comparative examples.

Example 1

Formation of a Transparent Electrode Layer

A SiO$_2$ thin film was formed on a surface of a polyethylene naphthalate (PEN) film substrate (thickness: 125 μm) by PVD, and an ITO film (film thickness: 150 nm, and sheet resistance: 20Ω/□), which would be a transparent electrode, was formed on the upper surface of the SiO$_2$ thin film by reactive ion plating (power: 3.7 kW, oxygen partial pressure: 73%, film-forming pressure; 0.3 Pa, film forming rate: 150 nm/minute, and substrate temperature: 20° C.) using a pressure gradient type plasma gun. Thereafter, the ITO film was patterned by etching. Next, the substrate, wherein the ITO pattern was formed, was washed with acetone, a substrate-washing solution, and IPA.
(Formation of a Hole Taking-Out Layer)

A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).
(Formation of an Electron Hole Transporting Layer (a First Layer))

At the ratio by weight of 3:5:2, the following were mixed; a 0.3% by weight solution of a polyalkylthiophene (P3HT; poly 3-hexylthiophene-2,5-diyl (regio-regular)) in chloroform; a 0.3% by weight solution of a polyphenylenevinylene (MDMO-PPV; poly(2-methoxy-5-(3',7'-dimethyloctyloxy)-1-4-phenylenevinylene) (weight-average molecular weight: 1,000,000) in chloroform; and a 0.1% by weight solution of a fullerene (PCBM; 1-(3-methoxycarbonyl)propyl-1-phenyl (6,6)-C$_{60}$) in chloroform. In this way, prepared was an electron hole transporting layer forming coating-solution for a first layer.

This electron hole transporting layer forming coating-solution was coated onto the hole taking-out layer by spin coating, and dried at 110° C. for 10 minutes so as to form an electron hole transporting layer (film thickness: 100 nm) which was the first layer.
(Formation of an Electron Hole Transporting Layer (a Second Layer))

At the ratio by weight of 3:1, the following were mixed: a 0.3% by weight solution of a polyalkylthiophene (P3HT; poly 3-hexylthiophene-2,5-diyl (regio-regular)) in chloroform; and a 0.1% by weight solution of a fullerene (PCBM; 1-(3-methoxycarbonyl)propyl-1-phenyl (6,6)-C$_{60}$) in chloroform. In this way, prepared was an electron hole transporting layer forming coating-solution for a second layer.

This electron hole transporting layer forming coating-solution was coated onto the first layer-electron hole transporting layer by spin coating, and dried at 110° C. for 10 minutes so as to form an electron hole transporting layer (film thickness: 100 nm) which was the second layer.
(Formation of a Metal Electrode)

Next, a Ca thin film (film thickness: 100 nm) and an Al thin film (film thickness: 500 nm) were successively formed on the second layer-electron hole transporting layer by vapor deposition to form a metal electrode.
(Production of an Organic Thin-Film Solar Cell)

Lastly, the resultant was sealed up from above the metal electrode with a sealing glass material, so as to manufacture an organic thin-film solar cell of a bulk hetero-junction type.

Example 2

Formation of a Transparent Electrode Layer

A SiO$_2$ thin film and an ITO pattern were formed on a polyethylene naphthalate (PEN) film substrate in the same way as in Example 1.
(Formation of a Hole Taking-Out Layer)

A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).
(Formation of an Electron Hole Transporting Layer (a First Layer))

At the ratio by weight of 5:3, the following were mixed: a 0.3% by weight solution of a polyphenylenevinylene (MDMO-PPV; poly(2-methoxy-5-(3',7'-dimethyloctyloxy)-1-4-phenylenevinylene) (weight-average molecular weight: 1,000,000) in chloroform; and a 0.1% by weight solution of a fullerene (PCBM; 1-(3-methoxycarbonyl)propyl-1-phenyl (6,6)-$C_{60}$) in chloroform. In this way, prepared was an electron hole transporting layer forming coating-solution for a first layer.

This electron hole transporting layer forming coating-solution was coated onto the hole taking-out layer by spin coating, and dried at 110° C. for 10 minutes so as to form an electron hole transporting layer (film thickness; 100 nm) which was the first layer.

(Formation of an Electron Hole Transporting Layer (a Second Layer))

At the ratio by weight of 5:3, the following were mixed: a 0.3% by weight solution of a polyalkylthiophene (P3HT; poly 3-hexylthiophene-2,5-diyl (regio-regular)) in chloroform; and a 0.1% by weight solution of a fullerene (PCBN; 1-(3-methoxycarbonyl)propyl-1-phenyl (6,6)-$C_{60}$) in chloroform. In this way, prepared was an electron hole transporting layer forming coating-solution for a second layer.

This electron hole transporting layer forming coating-solution was coated onto the first layer-electron hole transporting layer by spin coating, and dried at 110° C. for 10 minutes so as to form an electron hole transporting layer (film thickness: 100 nm) which was the second layer.

(Formation of a Metal Electrode)

Next, a Ca thin film (film thickness: 100 nm) and an Al thin film (film thickness: 500 nm) were successively formed on the second layer-electron hole transporting layer by vapor deposition to form a metal electrode.

(Production of an Organic Thin-Film Solar Cell)

Lastly, the resultant was sealed up from above the metal electrode with a sealing glass material, so as to manufacture an organic thin-film solar cell of a bulk hetero-junction type.

Example 3

Formation of a Transparent Electrode Layer

A $SiO_2$ thin film and an ITO pattern were formed on a polyethylene naphthalate (PEN) film substrate in the same way as in Example 1.

(Formation of a Hole Taking-Out Layer)

A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).

(Formation of an Electron Hole Transporting Layer (a First Layer))

At the ratio by weight of 3:5:2, the following were mixed: a 0.3% by weight solution of a polyalkylthiophene (P3HT; poly 3-hexylthiophene-2,5-diyl (regio-regular)) in chloroform; a 0.3% by weight solution of a polyphenylenevinylene (MOMO-PPV; poly(2-methoxy-5-(3',7'-dimethyloctyloxy)-1-4-phenylenevinylene) (weight-average molecular weight: 1,000,000) in chloroform; and a 0.1% by weight solution of a fullerene (PCBM; 1-(3-methoxycarbonyl)propyl-1-phenyl (6,6)-$C_{60}$) in chloroform. In this way, prepared was an electron hole transporting layer forming coating-solution for a first layer.

This electron hole transporting layer forming coating-solution was coated onto the hole taking-out layer by spin coating, and dried at 110° C. for 10 minutes so as to form an electron hole transporting layer film thickness: 100 nm) which was the first layer.

(Formation of an Electron Hole Transporting Layer (a Second Layer))

At the ratio by weight of 3:5:2, the following were mixed: a 0.3% by weight solution of a polyalkylthiophene (P3HT; poly 3-hexylthiophene-2,5-diyl (regio-regular)) in chloroform; a 0.3% by weight solution of a polyphenylenevinylene (MDMO-PPV; poly(2-methoxy-5-(3',7'-dimethyloctyloxy)-1-4-phenylenevinylene) (weight-average molecular weight: 1,000,000) in chloroform; and a 0.1% by weight solution of a fullerene (PCBM; 1-(3-methoxycarbonyl)propyl-1-phenyl (6,6)-$C_{60}$) in chloroform. In this way, prepared was an electron hole transporting layer forming coating-solution for a second layer.

This electron hole transporting layer forming coating-solution was coated onto the first layer-electron hole transporting layer by spin coating, and dried at 110° C. for 10 minutes so as to form an electron hole transporting layer (film thickness: 100 nm) which was the second layer.

(Formation of an Electron Hole Transporting Layer (a Third Layer))

At the ratio by weight of 1:1, the following were mixed: a 0.1% by weight solution of polyfluorene in chloroform; and a 0.1% by weight solution of a fullerene (PCBM; 1-(3-methoxycarbonyl)propyl-1-phenyl (6,6)-$C_{60}$) in chloroform. In this way, prepared was an electron hole transporting layer forming coating-solution for a third layer.

This electron hole transporting layer forming coating-solution was coated onto the second layer-electron hole transporting layer by spin coating, and dried at 110° C. for 10 minutes so as to form an electron hole transporting layer (film thickness: 100 nm) which was the third layer.

(Formation of a Metal Electrode)

Next, a Ca thin film (film thickness: 100 nm) and an Al thin film (film thickness: 500 nm) were successively formed on the third layer-electron hole transporting layer by vapor deposition to form a metal electrode.

(Production of an Organic Thin-Film Solar Cell)

Lastly, the resultant was sealed up from above the metal electrode with a sealing glass material, so as to manufacture an organic thin-film solar cell of a bulk hetero-junction type.

Example 4

Formation of a Transparent Electrode Layer

A $SiO_2$ thin film and an ITO pattern were formed on a polyethylene naphthalate (PEN) film substrate in the same way as in Example 1.

(Formation of a Hole Taking-Out Layer)

A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).

(Formation of a Hole Transporting Layer (a First Layer))

A polyphenylenevinylene (MDMO-PPV; poly(2-methoxy-5-(3',7'-dimethyloctyloxy)-1-4-phenylenevinylene) (weight-average molecular weight: 1,000,000) was dissolved into a solvent of chloroform, so as to give a concentration of 0.3% by weight, thereby preparing a hole transporting layer forming coating-solution. This hole transporting layer forming coating-solution was coated onto the hole taking-out layer by spin coating, and dried at 110° C. for 10 minutes so as to form an hole transporting layer (film thickness: 30 nm).

(Formation of an Electron Hole Transporting Layer (a Second Layer))

At the ratio by weight of 3:1, the following were mixed: a 0.3% by weight solution of a polyalkylthiophene (P3HT; poly 3-hexylthiophene-2,5-diyl (regio-regular)) in chloroform; and a 0.1% by weight solution of a fullerene (PCBM; 1-(3-methoxycarbonyl)propyl-1-phenyl $(6,6)$-$C_{60}$) in chloroform. In this way, prepared was an electron hole transporting layer forming coating-solution.

This electron hole transporting layer forming coating-solution was coated onto the hole transporting layer by spin coating, and dried at 110° C. for 10 minutes so as to form an electron hole transporting layer (film thickness: 100 nm).
(Formation of a Metal Electrode)

Next, a Ca thin film (film thickness: 100 nm) and an Al thin film (film thickness: 500 nm) were successively formed on the electron hole transporting layer by vapor deposition to form a metal electrode.
(Production of an Organic Thin-Film Solar Cell)

Lastly, the resultant was sealed up from above the metal electrode with a sealing glass material, so as to manufacture an organic thin-film solar cell of a bulk hetero-junction type.

Example 5

Formation of a Transparent Electrode Layer

A $SiO_2$ thin film and an ITO pattern were formed on a polyethylene naphthalate (PEN) film substrate in the same way as in Example 1.
(Formation of a Hole Taking-Out Layer)

A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).
(Formation of an Electron Hole Transporting Layer (a First Layer))

At the ratio by weight of 3:5:2, the following were mixed: a 0.3% by weight solution of a polyalkylthiophene (P3HT; poly 3-hexylthiophene-2,5-diyl (regio-regular)) in chloroform; a 0.33% by weight solution of a polyphenylenevinylene (MDMO-PPV; poly(2-methoxy-5-(3',7'-dimethyloctyloxy)-1-4-phenylenevinylene) (weight-average molecular weight: 1,000,000) in chloroform; and a 0.1% by weight solution of a fullerene (PCOM; 1-(3-methoxycarbonyl)propyl-1-phenyl $(6,6)$-$C_{60}$) in chloroform. In this way, prepared was an electron hole transporting layer forming coating-solution.

This electron hole transporting layer forming coating-solution was coated onto the hole taking-out layer by spin coating, and dried at 110° C. for 10 minutes so as to form an electron hole transporting layer (film thickness: 100 nm).
(Formation of an Electron Transporting Layer (a Second Layer))

A polyfluorene was dissolved into a solvent of chloroform, so as to give a concentration of 0.1% by weight, thereby preparing an electron transporting layer forming coating-solution. This electron transporting layer forming coating-solution was coated onto the electron hole transporting layer by spin coating, and dried at 110° C. for 10 minutes so as to form an electron transporting layer (film thickness: 30 nm).
(Formation of a Metal Electrode)

Next, a Ca thin film (film thickness: 100 nm) and an Al thin film (film thickness: 500 nm) were successively formed on the electron transporting layer by vapor deposition to form a metal electrode.
(Production of an Organic Thin-Film Solar Cell)

Lastly, the resultant was sealed up from above the metal electrode with a sealing glass material, so as to manufacture an organic thin-film solar cell of a bulk hetero-junction type.

Example 6

Formation of a Transparent Electrode Layer

A $SiO_2$ thin film and an ITO pattern were formed on a polyethylene naphthalate (PEN) film substrate in the same way as in Example 1.
(Formation of a Hole Taking-Out Layer)

A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).
(Formation of an Electron Hole Transporting Layer (a First Layer))

At the ratio by weight of 3:5:2, the following were mixed: a 0.3% by weight solution of a polyalkylthiophene (P3HT; poly3-hexylthiophene-2,5-diyl (regio-regular)) in chloroform; a 0.1% by weight solution of a fullerene (PCBM; 1-(3-methoxycarbonyl)propyl-1-phenyl $(6,6)$-$C_{60}$) in chloroform; and a 0.3% by weight solution of a polyphenylenevinylene (MDMO-PPV; poly(2-methoxy-5-(3',7'-dimethyloctyloxy)-1-4-phenylenevinylene (weight-average molecular weight: 1,200,000) in chloroform. This solution was filtrated with a filter paper of φ0.2 μm, so as to prepare an electron hole transporting layer forming coating-solution for a first layer.

This electron hole transporting layer forming coating-solution was coated onto the hole taking-out layer by spin coating, and dried at 110° C. for 10 minutes so as to form an electron hole transporting layer (film thickness: 30 nm) which was the first layer.
(Formation of an Electron Hole Transporting Layer (a Second Layer)

At the ratio by weight of 1:1, the following were mixed: a 0.3% by weight solution of polyphenylenevinylene (MDMO-PPV; poly(2-methoxy-5-(3',7'-dimethyloctyloxy)-1-4-phenylenevinylene (weight-average molecular weight: 1,200,000); and a 0.1% by weight solution of a fullerene (PCBM; 1-(3-methoxycarbonyl)propyl-1-phenyl $(6,6)$-$C_{60}$) in chloroform. This solution was filtrated with a filter paper of φ0.2 μm, so as to prepare an electron hole transporting layer forming coating-solution for a second layer.

This electron hole transporting layer forming coating-solution was coated onto the first layer-electron hole transporting layer by spin coating, and dried at 110° C. for 10 minutes so as to form an electron hole transporting layer (film thickness: 30 nm) which was the second layer.
(Formation of an Electron Hole Transporting Layer (a Third Layer))

At the ratio by weight of 1:1, the following were mixed: a 0.3% by weight solution of a polyalkylthiophene (P3HT; poly 3-hexylthiophene-2,5-diyl (regio-regular)) in chloroform; and a 0.1% by weight solution of a fullerene (PCBM; 1-(3-methoxycarbonyl)propyl-1-phenyl $(6,6)$-$C_{60}$) in chloroform. This solution was filtrated with a filter paper of φ0.2 μm, so as to prepare an electron hole transporting layer forming coating-solution for a third layer.

This electron hole transporting layer forming coating-solution was coated onto the second layer-electron hole transporting layer by spin coating, and dried at 110° C. for 10 minutes so as to form an electron hole transporting layer (film thickness: 30 nm) which was the third layer.
(Formation of a Metal Electrode)
Next, a Ca thin film (film thickness: 100 nm) and an Al thin film (film thickness: 500 nm) were successively formed on the third layer-electron hole transporting layer by vapor deposition to form a metal electrode.
(Production of an Organic Thin-Film Solar Cell)
Lastly, the resultant was sealed up from above the metal electrode with a sealing glass material, so as to manufacture an organic thin-film solar cell of a bulk hetero-junction type.

Example 7

Formation of a Transparent Electrode Layer

A $SiO_2$ thin film and an ITO pattern were formed on a polyethylene naphthalate (PEN) film substrate in the same way as in Example 1.
(Formation of a Hole Taking-Out Layer)
A hole taking-out layer forming coating-solution (a dispersion of an electroconductive polymer paste, poly(3,4)-ethylenedioxythiophene in water) was coated onto the substrate, wherein the ITO pattern was formed, by spin coating, and dried at 150° C. for 30 minutes to form a hole taking-out layer (film thickness: 100 nm).
(Formation of an Electron Hole Transporting Layer (a First Layer))
At the ratio by weight of 3:5:2, the following were mixed: a 0.3% by weigh; solution of a thiophene-fluorene copolymer (poly[(9,9-dihexylfluorenyl-2,7-diyl)-co(bithiophene)]) in chloroform; a 0.1% by weight solution of a tullerene (PCBM; 1-(3-methoxycarbonyl)propyl-1-phenyl (6,6)-$C_{60}$) in chloroform; and a 0.3% by weight solution of a polyphenylenevinylene (MDMO-PPV; poly(2-methoxy-5-(3',7'-dimethyloctyloxy)-1-4-phenylenevinylene (weight-average molecular weight: 1,200,000) in chloroform. This solution was filtrated with a filter paper of ϕ0.2 µm, so as to prepare an electron hole transporting layer forming coating-solution for a first layer.
This electron hole transporting layer forming coating-solution was coated onto the hole taking-out layer by spin coating, and dried at 110° C. for 10 minutes so as to form an electron hole transporting layer (film thickness: 30 nm) which was the first layer.
(Formation of an Electron Hole Transporting Layer (a Second Layer))
A polyphenylenevinylene (MDMO-PPV; poly(2-methoxy-5-(3',7'-dimethyloctyloxy)-1-4-phenylenevinylene (weight-average molecular weight: 1,200,000) was dissolved into a solvent of chloroform, so as to give a concentration of 0.3% by weight, thereby preparing an electron hole transporting layer forming coating-solution for a second layer.
This electron hole transporting layer forming coating-solution was coated onto the first layer-electron hole transporting layer by spin coating, and dried at 110° C. for 10 minutes so as to form an electron hole transporting layer (film thickness: 30 nm) which was the second layer.
(Formation of an Electron Hole Transporting Layer (a Third Layer))
At the ratio by weight of 1:1, the following were mixed: a 0.3% by weight solution of a thiophene-fluorene copolymer (poly[(9,9-dihexylfluorenyl-2,7-diyl)-co(bithiophene)]) in chloroform; and a 0.1% by weight solution of a fullerene (PCBM; 1-(3-methoxycarbonyl)propyl-1-phenyl (6,6)-$C_{60}$) in chloroform. This solution was filtrated with a filter paper of ϕ0.2 µm, so as to prepare an electron hole transporting layer forming coating-solution for a third layer.

This electron hole transporting layer forming coating-solution was coated onto the second layer-electron hole transporting layer by spin coating, and dried at 110° C. for 10 minutes so as to form an electron hole transporting layer (film thickness: 30 nm) which was the third layer.
(Formation of a Metal Electrode)
Next, a Ca thin film (film thickness: 100 nm) and an Al thin film (film thickness: 500 nm) were successively formed on the third layer-electron hole transporting layer by vapor deposition to form a metal electrode.
(Production of an Organic Thin-Film Solar Cell)
Lastly, the resultant was sealed up from above the metal electrode with a sealing glass material, so as to manufacture an organic thin-film solar cell of a bulk hetero-junction type.

What is claimed is:
1. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer comprises polyakylthiophene (P3HT), polyphenylenevinylene (MDMO-PPV) and fullerene wherein the P3HT and MDMO-PPV are at ratio of 3:5;
a second layer on the first layer, wherein the second layer comprises P3HT and fullerene; and
a metal electrode on the second layer, wherein at least one of the hole taking out layer, the first layer, and the second layer having a weight-average molecular weight of 100,000 or more.
2. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer comprises polyakylthiophene (P3HT), polyphenylenevinylene (MDMO-PPV) and fullerene wherein the P3HT and MDMO-PPV are at ratio of 5:3;
a second layer on the first layer, wherein the second layer comprises P3HT and fullerene; and
a metal electrode on the second layer, wherein at least one of the hole taking out layer, the first layer, and the second layer having a weight-average molecular weight of 100,000 or more.
3. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer comprises polyakylthiophene (P3HT), polyphenylenevinylene (MDMO-PPV) and fullerene wherein the P3HT and MDMO-PPV are at ratio of 3:5;
a second layer on the first layer, wherein the second layer comprises polyakylthiophene (P3HT), polyphenylenevinylene (MDMO-PPV) and fullerene wherein the P3HT and MDMO-PPV are at ratio of 3:5;
a third layer on the second layer, wherein the third layer comprises polyfluorene and fullerene; and
a metal electrode on the third layer, wherein at least one of the hole taking out layer, the first layer, and the second layer having a weight-average molecular weight of 100,000 or more.

4. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer, comprises polyphenylenevinylene (MDMO-PPV);
a second layer on the first layer, wherein the second layer comprises polyakylthiophene (P3HT) and fullerene; and
a metal electrode on the second layer, wherein at least one of the hole taking out layer, the first layer, and the second layer having a weight-average molecular weight of 100,000 or more.

5. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer comprises polyakylthiophene (P3HT), polyphenylenevinylene (MDMO-PPV) and fullerene wherein the P3HT and MDMO-PPV are at ratio of 3:5;
a second layer on the first layer, wherein the second layer comprises polyfluorene; and
a metal electrode on the second layer, wherein at least one of the hole taking out layer, the first layer, and the second layer having a weight-average molecular weight of 100,000 or more.

6. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer comprises polyakylthiophene (P3HT), polyphenylenevinylene (MDMO-PPV) and fullerene wherein the P3HT and MDMO-PPV are at ratio of 3:5;
a second layer on the first layer, wherein the second layer comprises polyphenylenevinylene (MDMO-PPV) and fullerene; and
a metal electrode on the second layer, wherein at least one of the hole taking out layer, the first layer, and the second layer having a weight-average molecular weight of 100,000 or more.

7. An organic thin-film solar cell comprising:
a transparent electrode;
a hole taking out layer on the transparent layer, the hole taking-out layer comprising poly (3,4) ethylenedioxythiophene;
a first layer on the hole taking out layer, wherein the first layer comprises polyakylthiophene (P3HT), polyphenylenevinylene (MDMO-PPV) and fullerene wherein the P3HT and MDMO-PPV are at ratio of 3:5;
a second layer on the first layer, wherein the second layer comprises MDMO-PPV;
a third layer on the second layer, wherein the third layer comprises poly[(9,9-dihexylfluorenyl-2,7-diyl)-co(bithiophene)] and fullerene; and
a metal electrode on the third layer, wherein at least one of the hole taking out layer, the first layer, and the second layer having a weight-average molecular weight of 100,000 or more.

\* \* \* \* \*